(12) United States Patent
Tsujimura et al.

(10) Patent No.: US 7,176,620 B2
(45) Date of Patent: Feb. 13, 2007

(54) ORGANIC LIGHT-EMITTING DEVICE, ORGANIC LIGHT-EMITTING DISPLAY APPARATUS, AND METHOD OF MANUFACTURING ORGANIC LIGHT-EMITTING DISPLAY APPARATUS

(75) Inventors: Takatoshi Tsujimura, Shiga (JP); Atsushi Tanaka, Shiga (JP); Kohji Murayama, Shiga (JP)

(73) Assignees: Chi Mei Optoelectronics Corp., Tainan Hsien (TW); Kyocera Corporation, Kyoto (JP)

( * ) Notice: Subject to any disclaimer, the term of this patent is extended or adjusted under 35 U.S.C. 154(b) by 238 days.

(21) Appl. No.: 10/669,889

(22) Filed: Sep. 25, 2003

(65) Prior Publication Data

US 2004/0108810 A1 Jun. 10, 2004

(30) Foreign Application Priority Data

Sep. 26, 2002 (JP) ............................. 2002-281527

(51) Int. Cl.
*H05B 33/06* (2006.01)
*H05B 33/00* (2006.01)

(52) U.S. Cl. ...................... 313/506; 313/504; 313/505; 428/690

(58) Field of Classification Search ................ 313/503; 257/640, E21.27
See application file for complete search history.

(56) References Cited

U.S. PATENT DOCUMENTS 5,480,841 A * 1/1996 Bickford et al. .............. 29/827
5,942,769 A * 8/1999 Grill et al. ..................... 257/77
6,351,067 B2 * 2/2002 Lee et al. .................... 313/504
6,372,628 B1 * 4/2002 Matsubara et al. ......... 438/622
6,486,559 B1 * 11/2002 Ueno ........................... 257/762
6,727,642 B1 * 4/2004 Cho et al. .................... 313/496
6,727,645 B2 * 4/2004 Tsujimura et al. .......... 313/504
6,833,667 B2 * 12/2004 Hamano et al. ............. 313/504
6,882,094 B2 * 4/2005 Dimitrijevic et al. ... 313/346 R

FOREIGN PATENT DOCUMENTS

EP 794569 A2 * 9/1997
JP 11031587 A * 2/1999

OTHER PUBLICATIONS

T. Sasaoka et al., "Late-News Paper: A 13.0-inch AM-OLED Display with Top Emitting Structure and Adaptive Current Mode Programmed Pixel Circuit (TAC)", SID Tech. Digest, 2001, pp. 384-387.

* cited by examiner

*Primary Examiner*—Sikha Roy
(74) *Attorney, Agent, or Firm*—Birch, Stewart, Kolasch & Birch, LLP

(57) ABSTRACT

An organic light-emitting display apparatus includes a substrate; an emission control circuit formed on the substrate; an insulating layer covering the control circuit; an organic light-emitting device including a first electrode and a second electrode and formed on the insulating layer; and a contact wiring structure for electrically connecting the emission control circuit and the organic light-emitting device. The contact wiring structure includes a first conductive layer made of the same material as the first electrode; a second conductive layer made of the same material as the second electrode; and a diamond-like carbon film between the first conductive layer and the second conductive layer.

12 Claims, 9 Drawing Sheets

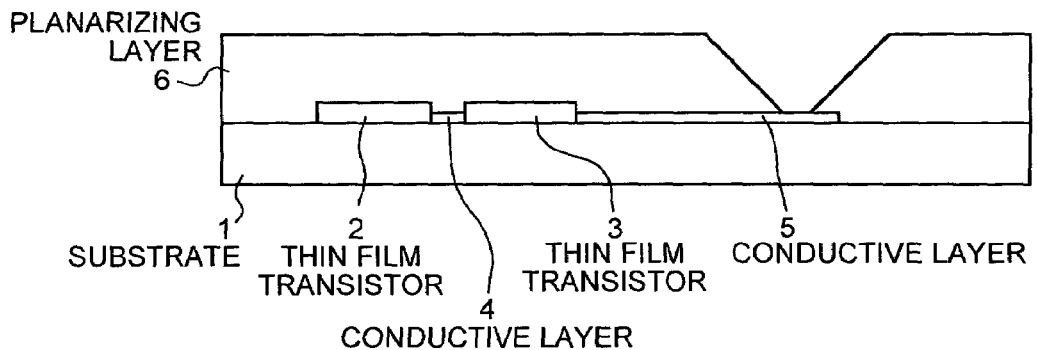
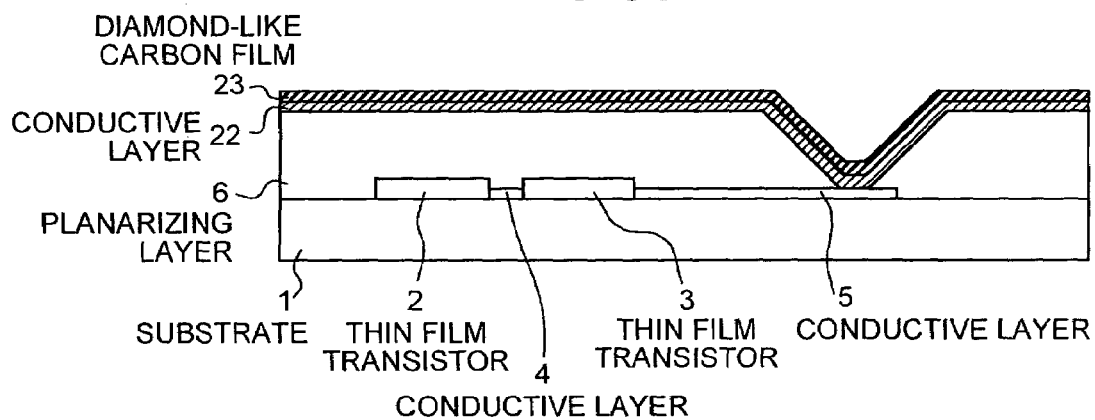
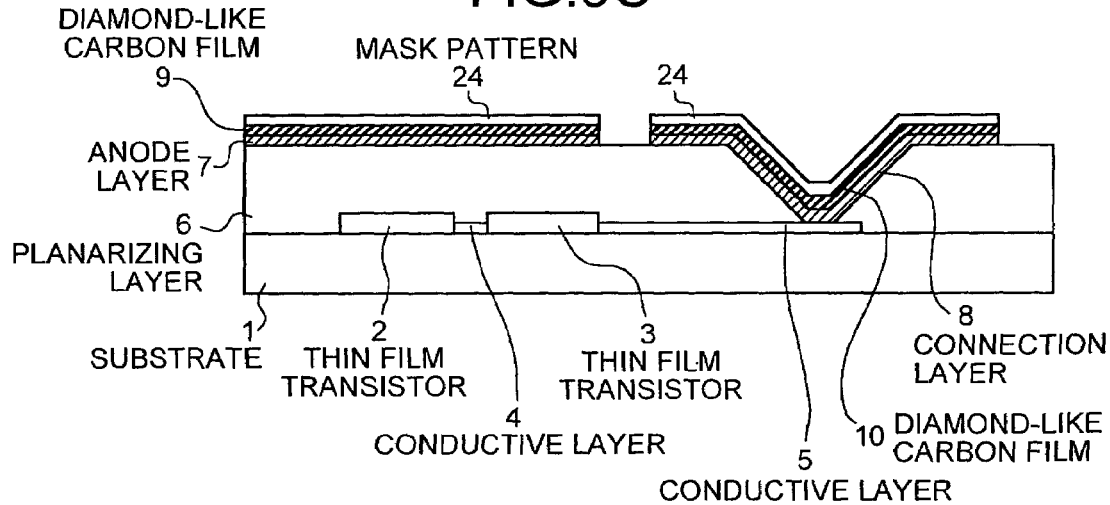

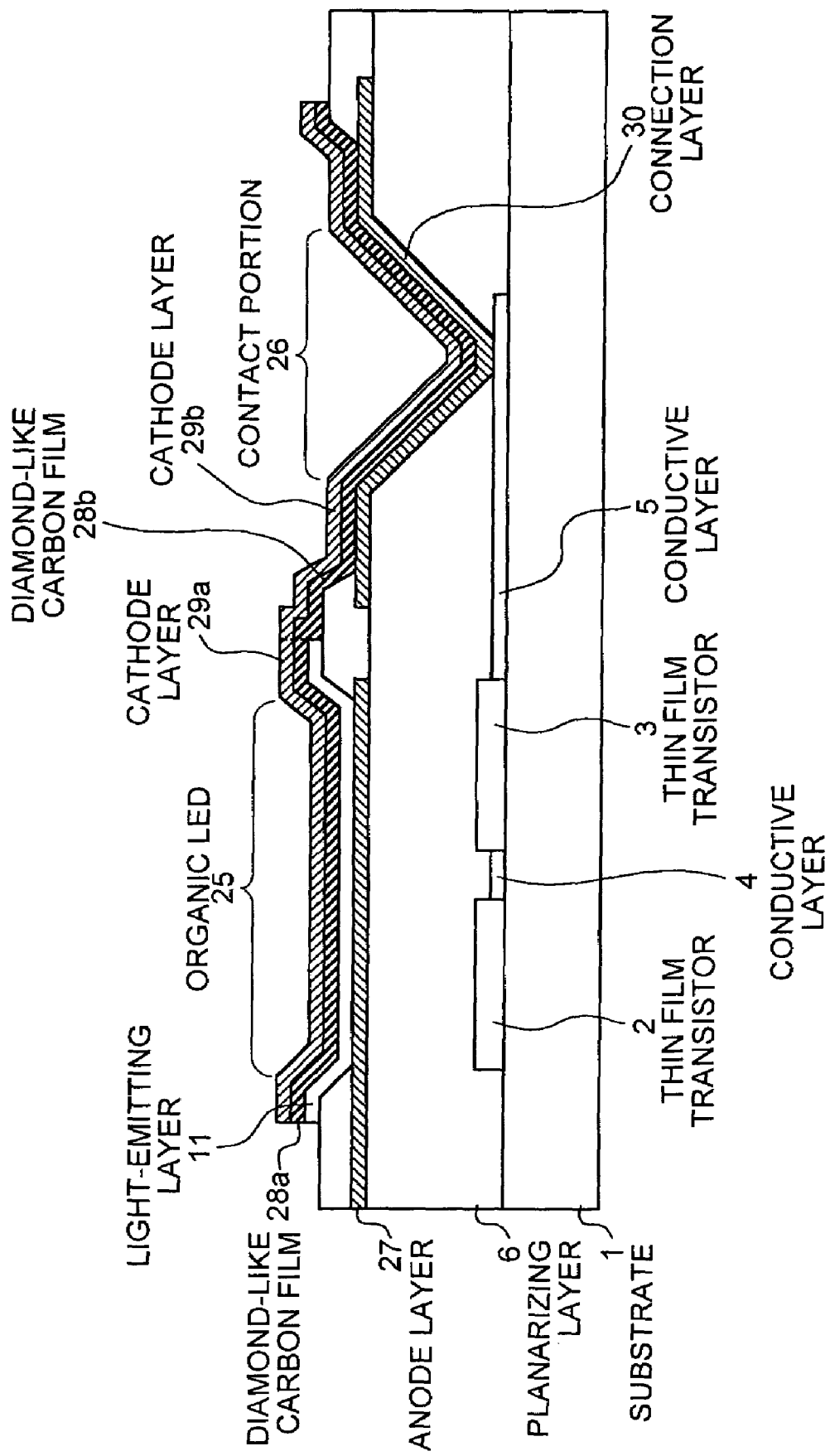

ORGANIC LIGHT-EMITTING DEVICE, ORGANIC LIGHT-EMITTING DISPLAY APPARATUS, AND METHOD OF MANUFACTURING ORGANIC LIGHT-EMITTING DISPLAY APPARATUS

BACKGROUND OF THE INVENTION

1) Field of the Invention

The present invention relates to an organic light-emitting device, an organic light-emitting display apparatus including the organic light-emitting device and a contact wiring structure that electrically connects its emission control circuit to the organic light-emitting device, and a method of manufacturing the organic light-emitting display apparatus.

2) Description of the Related Art

Organic light-emitting displays are attracting attention as candidates for flat display devices instead of liquid crystal displays. The organic light-emitting displays differ from the liquid crystal displays in that organic light-emitting diodes (LEDs) generating light are employed. In other words, the organic light-emitting displays do not require backlighting which the liquid crystal displays need. An organic LED has high speed response, high contrast, and high visibility. Further, an organic light-emitting display using the organic LED has a relatively simple structure, which is advantageous in view of manufacturing cost.

The organic LED has a mechanism that emits light by charge injection. Potential at each of the organic LEDs, particularly in a large-size display, tends to vary depending on its position. Of organic light-emitting displays referred to as top emission structure, one having anode line structure is considered to be promising at present, in which the anode electrode of the organic LED is extended up to a current source. This is because the anode electrode has generally low resistance and thus occurrence of a voltage drop between the current source and the organic LED is suppressed.

FIG. 9 is a sectional view illustrating a part of the structure in a conventional organic light-emitting display having the anode line structure. This organic light-emitting display has a multilayer structure in which a planarizing layer is formed to cover an emission control circuit formed on a substrate, and the organic LED is formed on the planarizing layer. As shown in FIG. 9, the organic LED 104 including an emitting layer 109 is located on the planarizing layer 106, while thin film transistors 102 and 103 constituting the emission control circuit are located on the substrate 101.

This organic light-emitting display also has a contact wiring structure in which the planarizing layer 106 has a hole for exposing a part of a conductive layer 105 at the bottom of the hole and the organic LED 104 is electrically connected to the thin film transistor 103 via the conductive layer 105. The cathode layer 110 is extended up to the exposed part of the conductive layer 105, to be connected to the conductive layer 105 electrically. Such a contact wiring structure is disclosed in, for example, "A 13.0-inch AM-OLED display with top emitting structure and adaptive current mode programmed pixel circuit", T. Sasaoka et al, SID Tech. Dig., 2001, pp. 384 to 387.

Since the light emitted from the organic LED 104 is output perpendicularly upwards, the cathode layer 110 located on the organic LED 104 needs to have excellent optical transmittances. Therefore, to ensure excellent optical transmittances, the cathode layer 110 is formed very thin, and for example, it has a film thickness of not larger than 10 nanometers. On the other hand, the planarizing layer 106 needs to have a larger film thickness to reduce parasitic capacitance, and has generally a film thickness of about from 2 to 5 micrometers. The cathode layer 110 extended up to the hole is disconnected at the side of the hole because of its thinness, in some cases. Therefore, to prevent disconnection, a connection layer 108 having a sufficient thickness is located below the cathode layer 110 and over the sides of the hole.

Since the connection layer 108 can be formed by the same process as the anode layer 107, a new process is not required for preparing the connection layer 108. As a result, disconnection between the organic LED 104 and the emission control circuit can be prevented, without increasing the manufacturing cost.

There are two problems with the organic light-emitting display having the structure shown in FIG. 9. The first problem is deterioration of the electric conductivity on the contact area between the connection layer 108 and the cathode layer 110. The connection layer 108, reinforcing the cathode layer 110 near the hole of the planarizing layer 106, is formed simultaneously with the formation of the anode layer 107, after depositing the planarizing layer 106 on the substrate 101. Therefore, the connection layer 108 is formed of the same material as the anode layer 107, and shows the same chemical characteristics as the anode layer 107. The anode layer 107 has not only a function as an electrode of the organic LED 104, but also a function as a hole injection layer. Therefore, the anode layer 107 is formed of a metal material having a large work function such as platinum (Pt), so that holes can be effectively injected to the emitting layer 109. Since the material of the connection layer 108 is the same as that of the anode layer 107, the connection layer 108 has a large work function.

On the other hand, the cathode layer 110 has not only a function as a cathode electrode of the organic LED 109, but also a function as an electron injection layer. The cathode layer 110 is formed of a material having a small work function, so that electrons can be effectively injected to the emitting layer 109. As a result, the work functions of the connection layer 108 and the cathode layer 110 differ largely from each other, and hence metal materials having largely different work functions come in contact with each other. As a result, the cathode layer 110 is effectively oxidized and corroded by a small amount of oxygen or moisture in air, because of its small work function. Particularly, the oxidation-reduction is promoted by current flowing into the cathode layer 110 and the connection layer 108. This leads to an increase in a resistance or a disconnection in the wiring structure.

Since the oxidation-reduction occurs in the contact area between the cathode layer 110 and the connection layer 108, an electrical connection on the contact area is broken, to cause disconnection between the organic LED 104 and the thin film transistor 103. As a result, the organic LED 104 cannot perform the function as a light-emitting device.

The second problem relates to a general organic LED. The cathode electrode and the anode electrode adjacent to the organic LED need to be formed of a material having a predetermined work function to perform charge injection effectively. Therefore, the option for the material of the cathode electrode and the anode electrode becomes very narrow, and it may be necessary to use a material, which is not always excellent in properties other than work function. For example, metal materials having a small work function and used for the cathode electrode, for example, magnesium (Mg) or calcium (Ca), easily react to moisture or oxygen in air. When such a metal material is used, oxidation is likely to occur due to the moisture and oxygen of about 1 parts per million, and hence it is necessary to cover the cathode electrode from air completely.

Further, the metal materials having a large work function and used for the anode electrode, for example, platinum (Pt) or iridium (Ir), tend to be more expensive than the metal materials such as Al used for ordinary conductive layers. These metal materials have not always excellent adherence to the planarizing layer 106 formed of a polymer, and there is the possibility that the anode layer 107 peels off from the planarizing layer 106 due to aged deterioration.

SUMMARY OF THE INVENTION

It is an object of the present invention to at least solve the problems in the conventional technology.

The organic light-emitting device according to one aspect of the present invention includes an emitting layer made of an organic material generating light by charge injection; an electrode to supply charges to the emitting layer; and a diamond-like carbon film between the emitting layer and the electrode.

The organic light-emitting display apparatus according to another aspect of the present invention includes a substrate; an emission control circuit formed on the substrate; an insulating layer covering the control circuit; an organic light-emitting device including a first electrode and a second electrode, and formed on the insulating layer; and a contact wiring structure for electrically connecting the emission control circuit and the organic light-emitting device, and including a first conductive layer made of the same material as the first electrode, a second conductive layer made of the same material as the second electrode, and a diamond-like carbon film between the first conductive layer and the second conductive layer.

The method of manufacturing an organic light-emitting diode display apparatus according to still another aspect of the present invention includes forming an emission control circuit on a substrate; forming an insulating layer to cover the emission control circuit; depositing on the insulating layer a first conductive layer electrically connected to the emission control circuit; depositing a first diamond-like carbon layer on the conductive layer; etching the first conductive layer and the first diamond-like carbon layer with a common mask to divide the first conductive layer into a first layer and a second layer, to divide the first diamond-like carbon layer into a first diamond-like carbon film on the first layer and a second diamond-like carbon film on the second layer; and forming on the second diamond-like carbon film an emitting layer made of an organic material generating light by charge injection.

The method of manufacturing an organic light-emitting diode display apparatus according to still another aspect of the present invention includes forming an emission control circuit on a substrate; forming an insulating layer to cover the emission control circuit; forming an electrode on the insulating layer; forming on the insulating layer a first conductive layer electrically connected to the emission control circuit; forming on the electrode an emitting layer made of an organic material generating light by charge injection; depositing a diamond-like carbon layer over the first conductive layer and the emitting layer; and depositing a second conductive layer on the diamond-like carbon layer.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIGS. 5A to 5C are diagrams illustrating a manufacturing process of the organic light-emitting display apparatus according to the first embodiment;

FIG. 7 is a sectional view of a part of a pixel in an organic light-emitting display apparatus according to the second embodiment;

DETAILED DESCRIPTION

Figure 1:
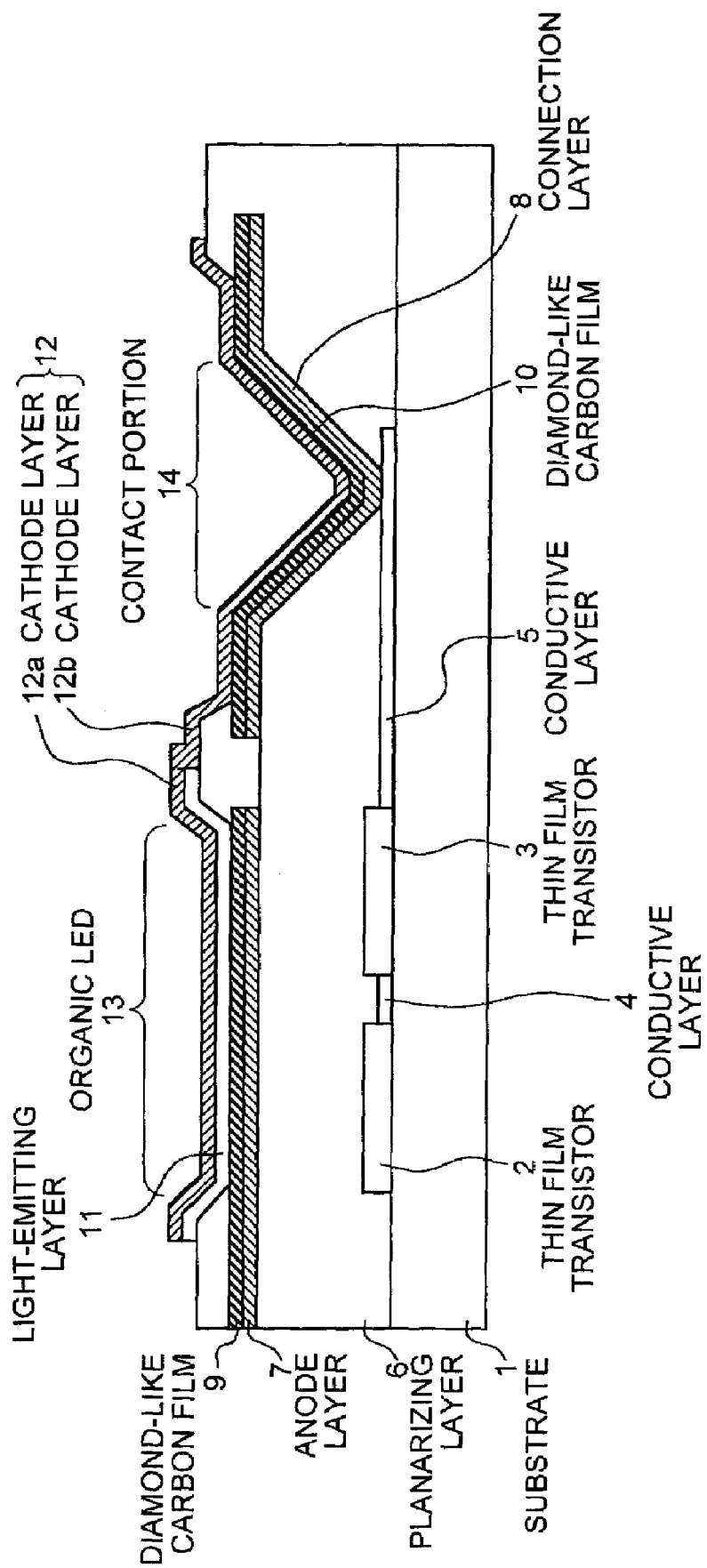
FIG. 1 is a sectional view of a part of a pixel in an organic light-emitting display apparatus according to the first embodiment.

Exemplary embodiments of an organic light-emitting device, an organic light-emitting display apparatus, and a method of manufacturing the organic light-emitting display apparatus according to the present invention will be explained below with reference to the drawings. In the drawings, identical or similar portions are attached with identical or similar reference symbols or names. It should be noted that the drawings are schematic views, and they do not exactly show detailed real parts. It is needless to mention that the drawings include portions of mutually different sizes or ratios. For the electrodes that constitute a thin film transistor, it is not necessary to distinguish between a source electrode and a drain electrode. Therefore, the two electrodes excluding the gate electrode will be referred to as source/drain electrodes.

The organic light-emitting display apparatus according to a first embodiment has the multilayer structure such that an emission control circuit and a light-emitting device are laminated on different layers. The organic light-emitting display apparatus also has a contact wiring structure in which the emission control circuit electrically is connected to an anode electrode of the light-emitting device via a conductive layer made of the same material as a cathode electrode of the light-emitting device. Further, a diamond-like carbon film is located between the light-emitting layer and the anode electrode, and in the contact wiring structure the other diamond-like carbon film is located between the conductive layer and the cathode electrode.

FIG. 1 is a sectional view of a part of a pixel in the organic light-emitting display apparatus according to the first embodiment.

In the organic light-emitting display apparatus, thin film transistors 2 and 3, and conductive layers 4 and 5, constituting the emission control circuit, are formed on a substrate 1. A planarizing layer 6 is formed to cover the thin film transistors 2 and 3, and the conductive layers 4 and 5, and has a hole located on a part of the conductive layer 5. A contact portion 14 is referred to as the contact wiring structure on the hole of the planarizing layer 6. An organic LED 13 is formed on the planarizing layer 6. The contact portion 14 is located so as to electrically connect a cathode layer 12 serving as the cathode electrode of the organic LED 13 and the conductive layer 5.

The thin film transistors 2 and 3 function as a switching device and a driver, respectively, for the organic LED 13. The thin film transistor 2 is connected to a predetermined data line and a predetermined scan line (not shown), to control the current flowing through the organic LED 13, based on a data signal from the data line and a scan signal from the scan line, thereby controlling the light emission of the organic LED 13.

The planarizing layer 6 is provided for three-dimensionally arranging the emission control circuit including the thin film transistors 2 and 3, and the light-emitting device corresponding to the organic LED 13. The planarizing layer 6 is made of a polymer or the like, and has a flat upper face. Such a structure in which the organic LED 13 is located on the planarizing layer 6, allows a light-emitting layer 11 of the organic LED 13 to be larger. This leads to a large organic light-emitting display apparatus having a large display area. The planarizing layer 6 needs to have a large film thickness to suppress the parasitic capacitance between the wiring structure located on the substrate 1 and the wiring structure located on the upper face of the planarizing layer 6 to a sufficiently low value, and the film thickness of the planarizing layer 6 is preferably about from 2 to 5 micrometers.

The organic LED 13 functions as a light-emitting device. Specifically, the organic LED 13 has a structure in which an anode layer 7, a diamond-like carbon film 9, the light-emitting layer 11, and a cathode layer 12a are sequentially laminated. A hole transport layer (not shown) may be provided on the anode side of the light-emitting layer 11, and an electron transport layer may be provided on the cathode side of the light-emitting layer 11.

The cathode layer 12a has a function as a cathode electrode, and a function as wiring for connecting the organic LED 13 and the contact portion 14. The cathode layer 12a is made of a metal material having a small work function, for example, magnesium (Mg), strontium (Sr), or calcium (Ca), for serving as the cathode electrode. Since the light emitted from the light-emitting layer 11 passes through the cathode layer 12a and is output upwards, the cathode layer 12a needs to have sufficient optical transmittance. Therefore, the cathode layer 12a is formed of a thin film structure having a film thickness as thin as about 5 to 40 nanometers.

The light-emitting layer 11 is for actually emitting light, based on the current input to the organic LED 13. Specifically, electrons injected from the cathode side and holes injected from the anode side are recombined in the light-emitting layer 11, to emit light. The light-emitting layer is made of an organic material, such as phthalocyanine, tris-aluminum complex, benzo-quinolinolato, or beryllium complex, and predetermined impurities may be added if necessary.

The anode layer 7 serves as an anode electrode of the organic LED 13, and connects the anode side of the organic LED 13 to a power source line. In the first embodiment, the anode layer 7 is made of a metal material such as Al or Cu.

The diamond-like carbon film 9 serves as a hole injection layer, which supplies holes to the light-emitting layer 11, and is made of diamond-like carbon. The diamond-like carbon is also referred to as DLC, or amorphous carbon, and has an amorphous structure. The bond state of carbon atoms in the diamond-like carbon is constructed from a diamond structure (SP3 bond) and a graphite structure (SP2 bond), and may include a structure in which carbon partially bonds with hydrogen. Further, impurities other than carbon and hydrogen are also contained at a certain ratio, depending on the film forming condition. When the diamond-like carbon has a structure in which carbon partially bonds with hydrogen, the diamond-like carbon is also referred to as amorphous carbon hydride, or diamond-like carbon hydride.

The diamond-like carbon has a property capable of changing the work function within a range of from 0.5 to 5.6 electron volts, by changing the ratio or the like between diamond structure and the graphite structure. For example, the ratio between the diamond structure and the graphite structure is changed by adjusting the quantity of hydrogen supplied together with carbon as a raw material, at the time of film forming, thereby to change the work function. From the standpoint of increasing the work function, addition of fluorine is also effective. In the first embodiment, the diamond-like carbon film 9 has an amorphous structure in which a predetermined amount of fluorine is added.

Figure 2:
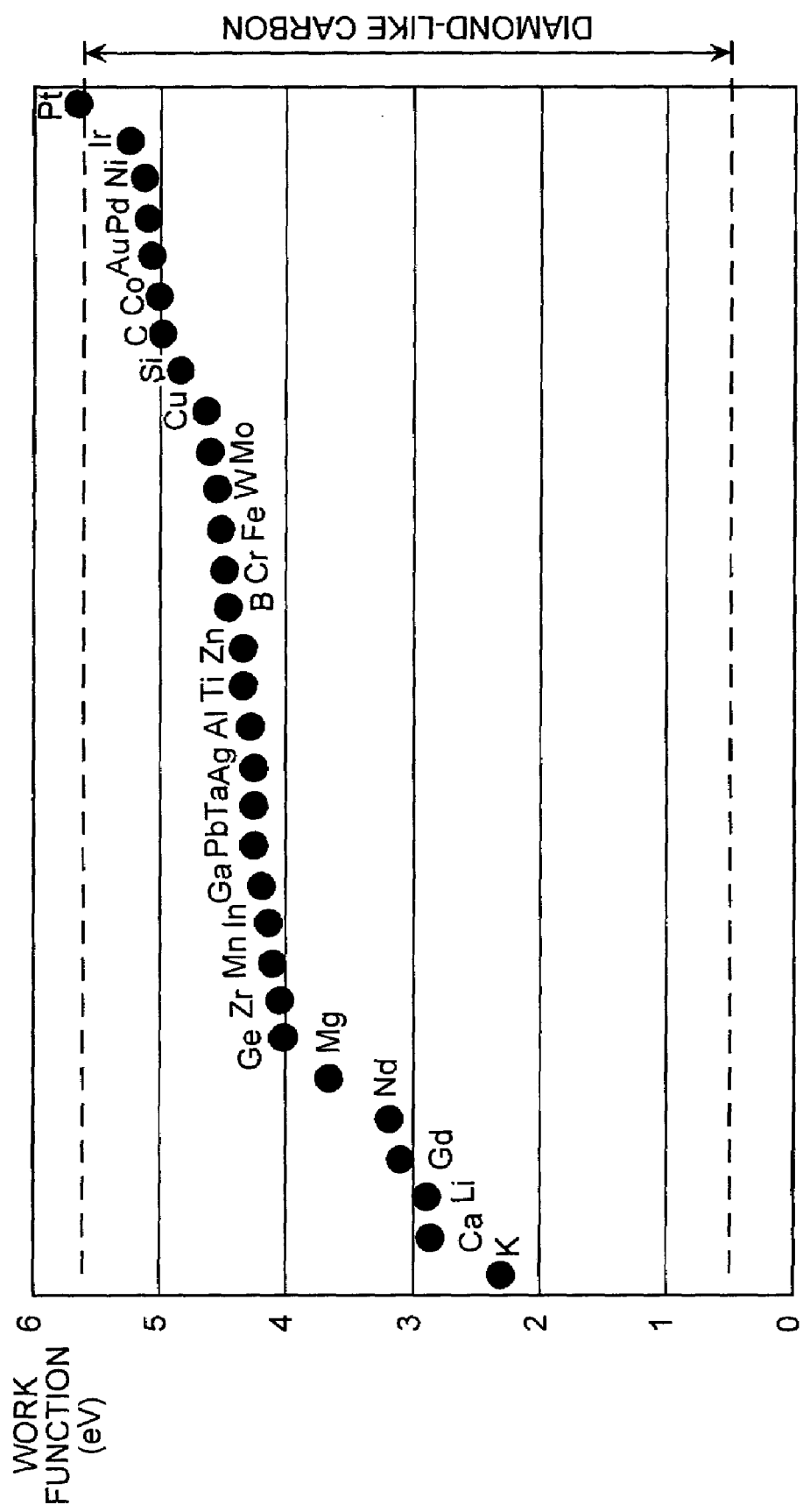
FIG. 2 is a graph of work functions with respect to diamond-like carbon and general metals.

FIG. 2 is a graph in which the upper limit and the lower limit of the work function of the diamond-like carbon is compared with work functions of general metal materials. As shown in FIG. 2, the work function of the diamond-like carbon has a value of from 0.5 to 5.6 electron volts. On the other hand, the work functions of general metal materials are larger than 2 electron volts even in potassium (K) having the lowest value, and even platinum (Pt) having the highest value has a work function of 5.7 electron volts at most. Therefore, the work functions of substantially all metal materials are within the variation range of the work function of the diamond-like carbon, and hence the diamond-like carbon can be used instead of the metal materials shown in FIG. 2.

In the first embodiment, the diamond-like carbon film 9 is formed so as to have a work function of about 5.6 electron volts. This is because the diamond-like carbon film 9 is located on the anode side of the light-emitting layer 11. In other words, since the organic LED 13 has a structure such that holes are injected from the anode side, the portion abutting against the light-emitting layer 11 needs to have a high work function to supply a sufficient amount of holes to the light-emitting layer 11.

Figure 3:
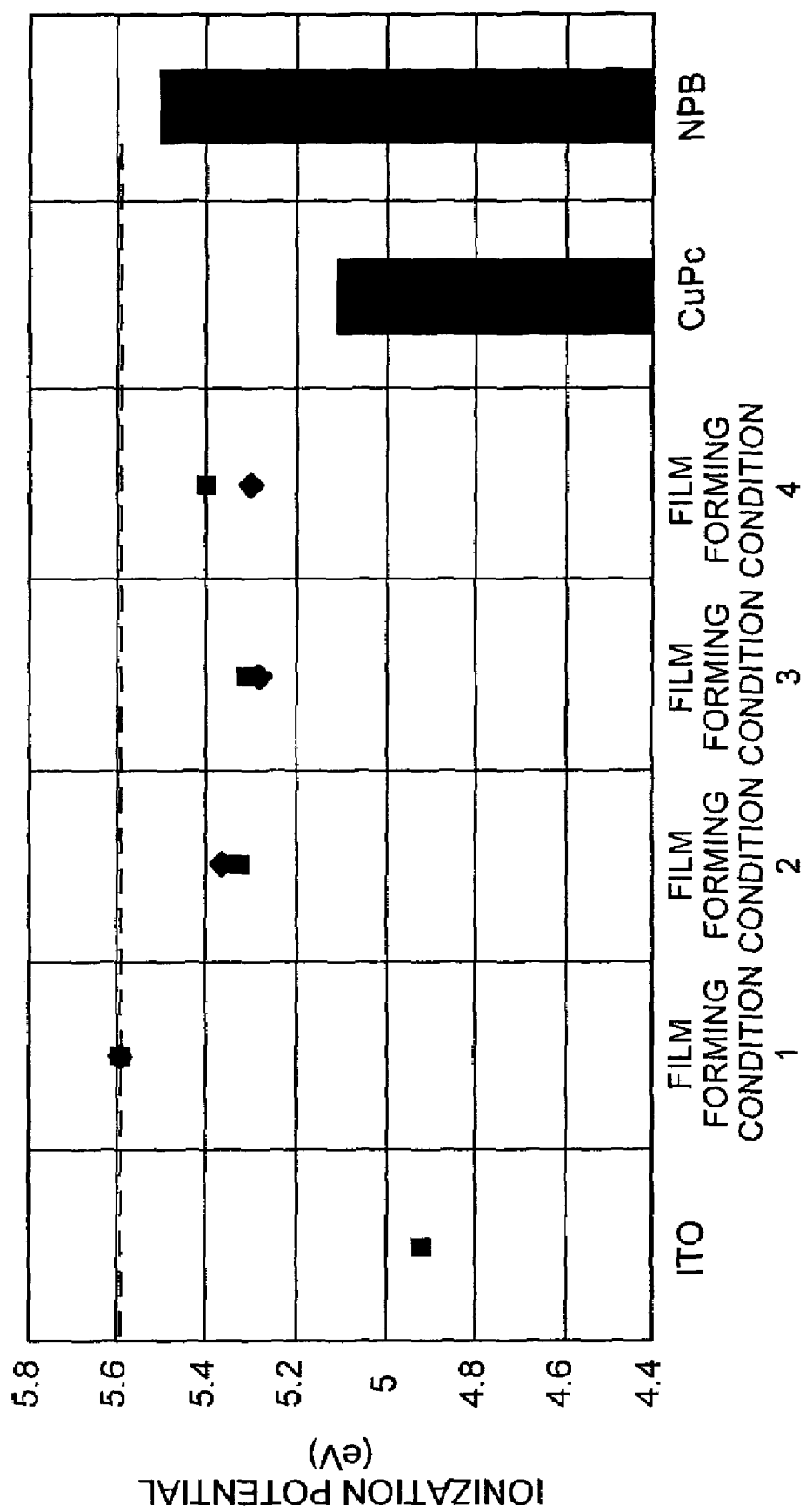
FIG. 3 is a graph of ionization potentials of the diamond-like carbon formed under different condition.

FIG. 3 is a graph of ionization potentials of the diamond-like carbon film 9 formed under different condition. Specifically, in FIG. 3, the ionization potentials of the diamond-like carbon film formed based on the film forming conditions 1 to 4, in which predetermined parameters are respectively changed, are compared with the ionization potentials of indium tin oxide (hereinafter "ITO"), copper phthalocyanine (hereinafter, "CuPc"), and N Propyl Bromide (hereinafter, "NPB") as other materials.

As shown in FIG. 3, the ionization potentials of the diamond-like carbon film 9 indicate about 5.3 electron volts at the lowest, and as a result, even the diamond-like carbon film having the lowest ionization potential can realize a higher ionization potential than that of ITO and CuPc. Even when compared with NPB, which is a representative material for the hole injection layer, it is obvious from the graph in FIG. 3 that the diamond-like carbon film formed under the film forming condition 1 has a higher ionization potential. Therefore, by optimizing the film forming condition of the diamond-like carbon film, a hole injection layer having a higher ionization potential and a more excellent hole injection function than those of conventional materials can be formed.

Further, the anode layer 7 located below the diamond-like carbon film 9 can be formed of an optional metal material, by having a structure in which the diamond-like carbon film 9 is located therein. Since a structure in which the anode layer 7 directly comes in contact with the light-emitting layer 11 has been heretofore employed, it is necessary to use a metal material having a large work function, such as Pt, Ir, or the like, to achieve the hole injection function. In the first embodiment, however, since the diamond-like carbon film 9 performs the hole injection function, any limitation is not imposed on the work function of the material forming the anode layer 7, and hence an optional material can be used. As a result, a metal material, such as Al or Cu, having excellent electrical conduction property and adherence with respect to the planarizing layer 6 can be used as a material for the anode layer 7.

The contact portion 14 is for connecting the organic LED 13 with the emission control circuit located on the substrate 1, and specifically, with the conductive layer 5, being a part of the emission control circuit. The contact portion 14 has a structure in which the connection layer 8, the diamond-like carbon film 10, and a cathode layer 12b are sequentially laminated, and has a function of electrically connecting the organic LED 13 and the emission control circuit on the substrate 1, by bringing the connection layer 8 into contact with the conductive layer 5 and connecting the cathode layer 12b with the cathode layer 12a.

The cathode layer 12b is for electrically connecting the contact portion 14 and the organic LED 13. The cathode layer 12b is formed by the same process as the cathode layer 12a. Therefore, the cathode layer 12b is formed of the same material as the cathode layer 12a, and in a film thickness as thin as about from 5 to 40 nanometers, together with the cathode layer 12a. In the first embodiment, the cathode layers 12a and 12b are actually formed integrally, but explained separately for easy understanding of this embodiment. When the cathode layers 12a and 12b are handled together, these are referred to as a cathode layer 12.

The connection layer 8 is for ensuring electrical connection in the contact portion 14. Since the cathode layer 12b is very thin, particularly on the sides of the hole, it is difficult to ensure a sufficient electrical conduction property only by the cathode layer 12b. The connection layer 8 is formed by the same process as the anode layer 7, and hence is formed of the same material as the anode layer and in the same film thickness 7.

The diamond-like carbon film 10 is for suppressing deterioration of the cathode layer 12b. The diamond-like carbon film 10 is formed by the same process as the diamond-like carbon film 9, and contains a predetermined amount of fluorine and has a high work function as in the diamond-like carbon film 9.

In the first embodiment, since the contact portion 14 has such a structure, following advantages can be obtained. The first advantage is that deterioration of the cathode layer 12b can be suppressed by having a structure such that the diamond-like carbon film 10 is located between the connection layer 8 and the cathode layer 12b. In other words, in the organic light-emitting display apparatus according to the first embodiment, it can be prevented that the connection layer 8 comes in direct contact with the cathode layer 12 in the contact portion 14. Therefore, even when a small amount of oxygen, moisture, and the like infiltrates into the organic light-emitting display apparatus, oxidation and corrosion of the cathode layer 12b can be suppressed, and an excellent electrical conduction property can be ensured in the contact portion 14. Since the diamond-like carbon film 10 put between the connection layer 8 and the cathode layer 12b is not formed of a metal material, oxidation of the cathode layer 12b is not promoted. As a result, the electrical conduction property of the contact portion 14 does not deteriorate due to a direct contact of the diamond-like carbon film 10 and the cathode layer 12b.

By arranging the connection layer 8, the light-emitting layer 11 can be reliably connected to the conductive layer 5 formed on the emission control circuit on the substrate 1. To output the light emitted from the light-emitting layer 11 perpendicularly upwards, it is necessary to form the cathode layer 12 very thin. On the other hand, since the planarizing layer 6 has a film thickness of about from 2 to 5 micrometers, the cathode layer 12b is located in the contact portion 14 over the difference in level of about from 2 to 5 micrometers. Therefore, there is the possibility that a stepped cut occurs in the difference in level (on the sides of the hole) in the cathode layer 12b to cause disconnection. On the other hand, by arranging the connection layer 8 below the cathode layer 12, disconnection in the contact portion 14 is prevented, thereby realizing excellent electrical connection between the organic LED 13 and the conductive layer 5.

When the anode layer 7 is made of Al, Cu, or the like, the connection layer 8 is made of the same material as the anode layer 7. Since the connection layer 8 is also located in a close contact with the hole of the planarizing layer 6, the adherence of the connection layer 8 with respect to the planarizing layer 6 is also improved from the same reason as in the anode layer 7 in the organic LED 13. As a result, peeling of the film due to aged deterioration can be prevented. Further, since the electrical conduction property of the connection layer 8 is improved by using Al or Cu, there is an advantage in that the electrical resistance of the entire contact portion 14 can be suppressed.

Figure 4:
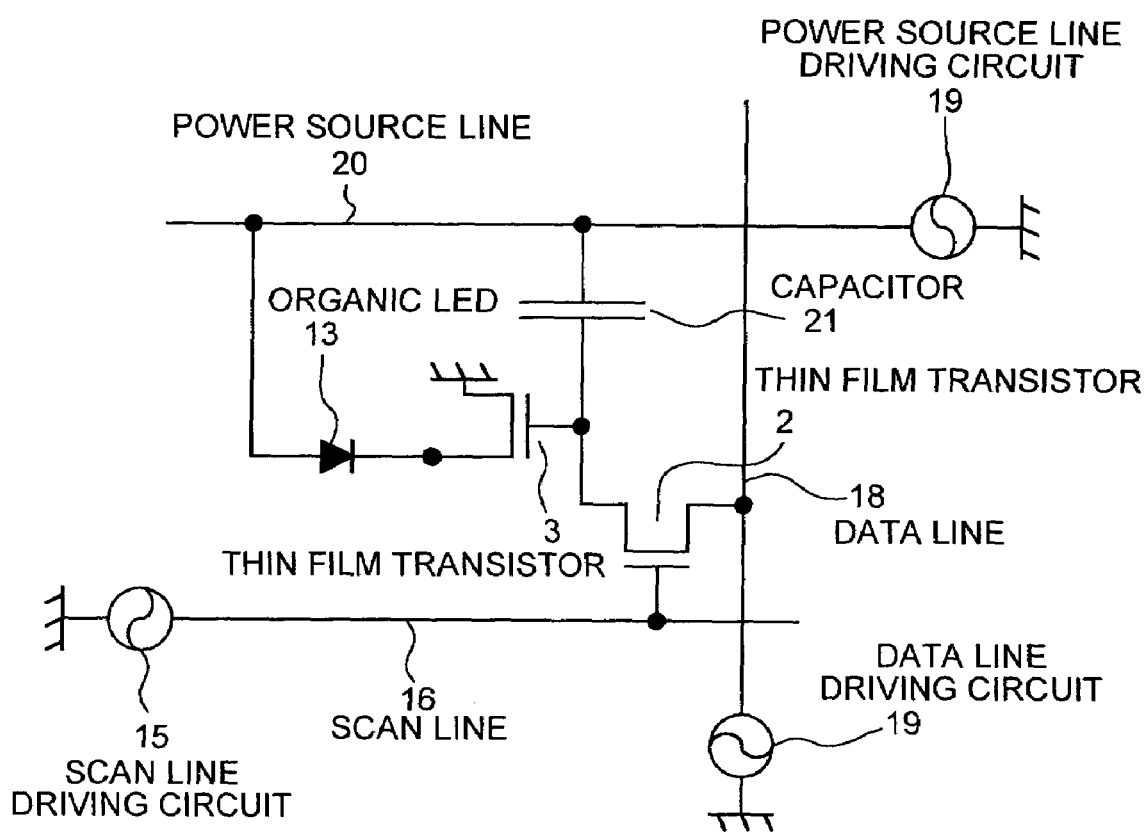
FIG. 4 is an equivalent circuit diagram indicating a connection of a pixel in the organic light-emitting display apparatus.

FIG. 4 is an equivalent circuit diagram indicating a connection between the thin film transistors 2 and 3 and the organic LED 13. As shown in FIG. 4, the cathode side of the organic LED 13 and the thin film transistor 3 are connected to each other via one of the source/drain electrodes of the thin film transistor 3, and the thin film transistor 3 serves as a driver that controls the light emission of the organic LED 13. The organic LED 13 and the thin film transistor 3 are connected to each other via the contact portion 14 and the conductive layer 5 as shown in FIG. 1. One of the source/drain electrodes of the thin film transistor 2 is connected to the gate electrode of the thin film transistor 3, and the thin film transistor 2 serves as a switching device by controlling ON and OFF of the thin film transistor 3.

The gate electrode of the thin film transistor 2 is connected to a scan line 16, and the other of the source/drain electrodes is connected to a data line 18. The anode side of the organic LED 13 is connected to the power source line 20, and a capacitor 21 is located between the other of the source/drain electrodes of the thin film transistor 2 and the power source line 20. The scan line 16, the data line 18, and the power source line 20 are connected to a scan line driving circuit 15 that supplies scan signals, a data line driving circuit 17 that supplies data signals, and a power source line driving circuit 19 that supplies electric current, respectively.

A predetermined charge is transferred from the thin film transistor 2 to the capacitor 21 based on the supplied scan signal and data signal, and the thin film transistor 3 controls the current to be supplied from the power source line driving circuit 19 to the organic LED 13, based on the transferred charge. The light emission state of the organic LED 13 is determined by such control, thereby enabling a display of a predetermined image.

The method of manufacturing the organic light-emitting display apparatus according to the first embodiment will be explained below. FIGS. 5A to 5C and FIGS. 6A to 6C illustrate the manufacturing process of the organic light-emitting display apparatus according to the first embodiment.

As shown in FIG. 5A, after the emission control circuit including the thin film transistors 2 and 3 and the conductive layers 4 and 5 are formed on the substrate 1, the planarizing layer 6 is deposited thereon by, for example, spin coating. When forming the planarizing layer 6, for example, a polymer is laminated over the whole surface of the substrate 1, a mask pattern having an opening at a position corresponding to a part of the conductive layer 5 is then formed by photolithographic, to form a hole with a part of the conductive layer 5 exposed by etching.

As shown in FIG. 5B, a conductive layer 22 and a diamond-like carbon film 23 is sequentially laminated thereon by, for example, a chemical vapor deposition (hereinafter, "CVD"). The diamond-like carbon film 23 is laminated after having adjusted the amount of the raw material gas for supplying hydrogen and fluorine so as to have a high work function.

As shown in FIG. 5C, a predetermined mask pattern 24 is formed, to form the anode layer 7, the connection layer 8, and the diamond-like carbon films 9 and 10 by etching. Specifically, a photoresist is applied over the whole surface of the diamond-like carbon film 23 by, for example, spin coating. The mask pattern 24 having an opening in a predetermined region is then formed by photolithographic. The anode layer 7, the connection layer 8, and the diamond-like carbon films 9 and 10 are formed by etching with the formed mask pattern 24. After finishing this process, the mask pattern 24 is removed.

Figure 6A:
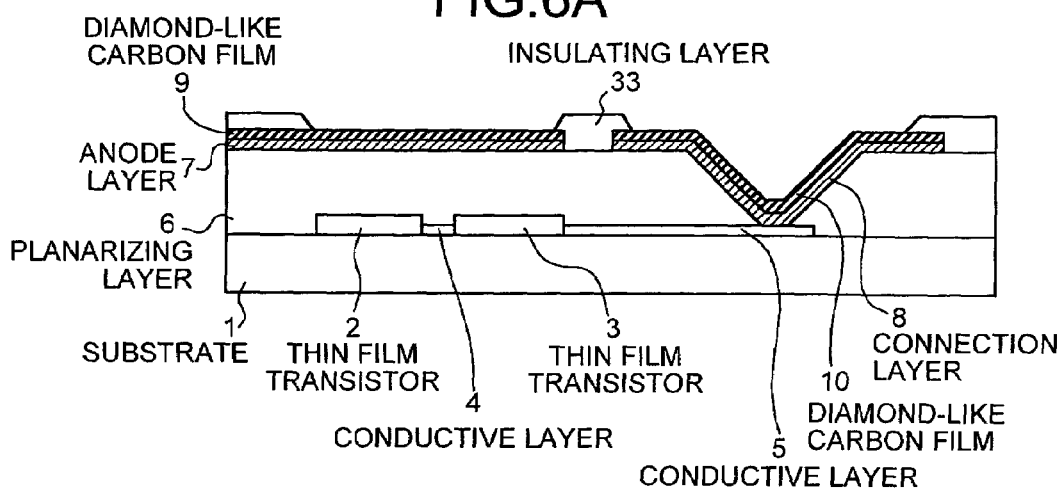
FIGS. 6A to 6C are diagrams illustrating a manufacturing process of the organic light-emitting display apparatus according to the first embodiment.

As shown in FIG. 6A, an insulating layer 33 for separating the devices is deposited. Such an insulating layer has a shape as shown in FIG. 6A, obtained by laminating an insulating material over the whole surface by, for example, the CVD, and performing predetermined etching.

Figure 6B:
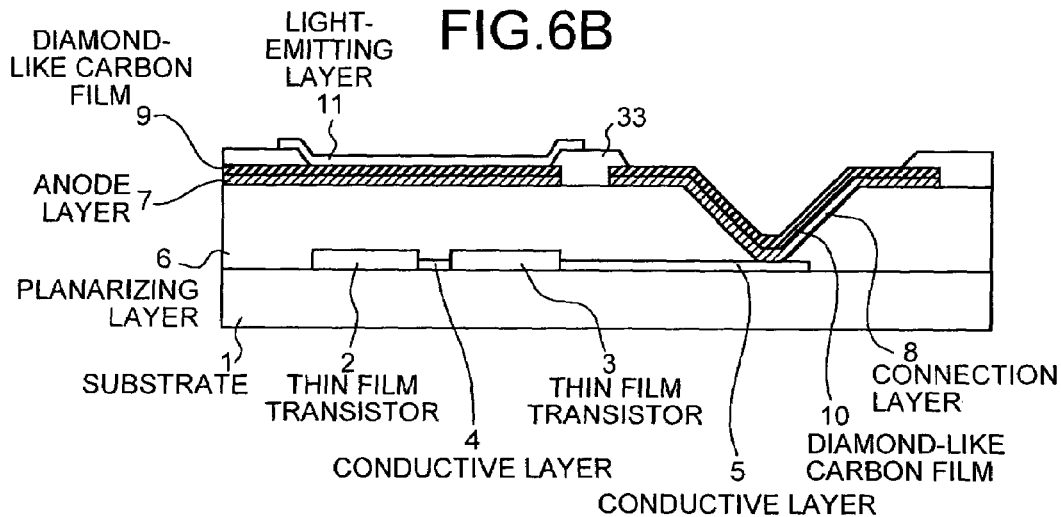

As shown in FIG. 6B, the light-emitting layer 11 is formed. Specifically, a predetermined shadow mask is used and a predetermined material is deposited by, for example, vacuum evaporation. This is because the glass transition temperature of the organic material constituting the light-emitting layer 11 is about 120 degrees centigrade, and when the material is laminated at a higher temperature, it is difficult to allow the material to function as the light-emitting layer 11. Therefore, if the material can be deposited at a temperature not higher than the glass transition temperature thereof, a method other than the vacuum evaporation may be used.

Figure 6C:
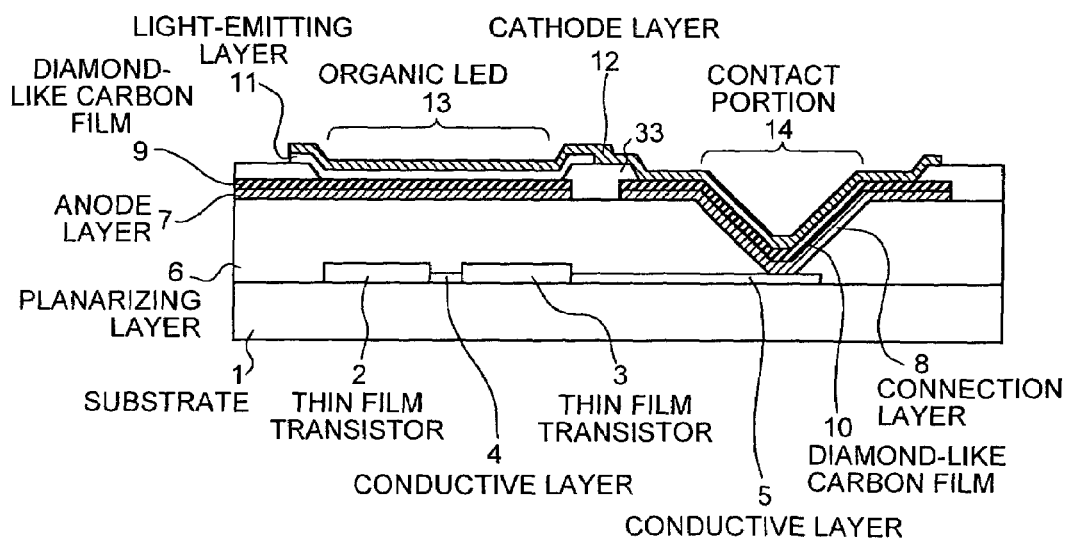

As shown in FIG. 6C, the cathode layer 12 is then formed. Since the light-emitting layer 11 has been already laminated, it is necessary to form the cathode layer 12 at a temperature lower than the glass transition temperature of the light-emitting layer 11. Therefore, also in this process, the cathode layer 12 is laminated by vacuum evaporation, using, for example, a predetermined shadow mask. Through the above processes, the organic light-emitting display apparatus according to the first embodiment is manufactured.

By using such a method of manufacturing the organic light-emitting display apparatus, the following advantages can be obtained. As shown in FIGS. 5B and 5C, after the conductive layer 22 and the diamond-like carbon film 23 are deposited, the anode layer 7, the connection layer 8, and the diamond-like carbon films 9 and 10 are formed by using a single mask pattern 24. As a result, though the diamond-like carbon films 9 and 10 are newly located, the same mask pattern as the conventional one can be used as the mask pattern required for manufacturing, thereby suppressing an increase in the manufacturing cost.

Since etching is performed at a time by using the single mask pattern 24, occurrence of misregistration of the mask can be prevented. When the cathode layer 12b located on the diamond-like carbon film 10 comes in direct contact with the connection layer 8, oxidation and corrosion of the cathode layer 12b is promoted. Therefore, it is necessary to form the diamond-like carbon film 10 so as to cover the connection layer 8. However, when the connection layer 8 and the diamond-like carbon film 10 are formed using a different mask pattern, there is the possibility that a part of the surface of the connection layer 8 is exposed due to a misregistration. In this manufacturing method, since etching is performed at a time by using the same mask pattern, such a situation does not occur, and direct contact between the connection layer 8 and the cathode layer 12b can be prevented.

In the method of manufacturing the organic light-emitting display apparatus, after the conductive layer 22 and the diamond-like carbon film 23 are deposited, etching may be performed by a separate mask pattern, so that the diamond-like carbon film 9 remains only below the light-emitting layer 11. Further, as the method of depositing the conductive layer 22 and the diamond-like carbon film 23, vacuum evaporation, a molecular beam epitaxy (MBE), or the like may be used other than the CVD.

The organic light-emitting display apparatus according to the second embodiment will be explained below. This organic light-emitting display apparatus has a structure such that the diamond-like carbon films 9 and 10 are omitted, and a diamond-like carbon film is newly located below the cathode layer, as compared with the first embodiment. Like parts as in the first embodiment are denoted by like reference signs, and have the same structure and function, unless otherwise specified.

FIG. 7 is a sectional view of a part of a pixel in the organic light-emitting display apparatus according to the second embodiment. As shown in FIG. 7, the thin film transistors 2 and 3 and the conductive layers 4 and 5 constituting the emission control circuit are located on the substrate 1. The planarizing layer 6 having the hole on a partial region of the conductive layer 5 is located on the substrate 1, the thin film transistors 2 and 3, and the conductive layers 4 and 5. An organic LED 25 is located on the upper face of the planarizing layer 6. A contact portion 26 is located along the hole of the planarizing layer 6, so as to electrically connect the cathode side of the organic LED 25 and the conductive layer 5.

The organic LED 25 functions as a light-emitting device. Specifically, the organic LED 25 has a structure in which an anode layer 27, the light-emitting layer 11, a diamond-like carbon film 28a, and a cathode layer 29a are sequentially laminated. A hole transport layer (not shown) and an electron transport layer (not shown) may be provided, if necessary, as is described in the first embodiment.

The anode layer 27 has a function as an anode electrode, and a function of connecting the organic LED 25 with the power source line (not shown). The anode layer 27 is formed of a material having a large work function, such as Pt, Ir, or the like, to function as the anode electrode.

The diamond-like carbon film 28a functions as an electron injection layer, which supplies electrons to the light-emitting layer 11. The diamond-like carbon film 28a is the same as in the first embodiment in that it has an amorphous structure in which a predetermined amount of hydrogen is added, and the diamond structure and the graphite structure exist together, but to fulfill the electron supply function, the work function of the diamond-like carbon film 28a is kept low. Specifically, the diamond-like carbon film 28a is formed such that the work function becomes for example about 0.5 electron volts. In the organic light-emitting display apparatus according to the second embodiment, the light emitted from the light-emitting layer 11 is output upwards, but the diamond-like carbon film 28a located above the light-emitting layer 11 does not interrupt transmission of light. This is because the diamond-like carbon has a property of improving the optical transmittance, by adding a predetermined amount of hydrogen, and in the organic light-emitting display apparatus, the diamond-like carbon film 28a is formed sufficiently thin for transmitting the light.

The cathode layer 29a is for connecting the organic LED 25 and the contact portion 26. Connection is possible only by the diamond-like carbon films 28a and 28b, but from a standpoint of decreasing the connection resistance, it is necessary to arrange the cathode layer 29a.

Since the diamond-like carbon film 28a fulfills the electron supply function, the cathode layer 29a may be formed of an optional metal material. In the second embodiment, from a standpoint of ensuring excellent electrical conduction property, the cathode layer 29a is formed of Al, Cu, or the like having a low resistance. As in the first embodiment, the light emitted from the light-emitting layer 11 passes through the cathode layer 29a and is output to the outside. Therefore, the cathode layer 29a is very thin, and specifically, has a film thickness of about from 5 to 40 nanometers.

The contact portion 26 is for connecting the organic LED 25 with the conductive layer 5, being a part of the emission control circuit located on the substrate 1. Specifically, the contact portion 26 has a structure in which a connection layer 30, the diamond-like carbon film 28b, and a cathode layer 29b are sequentially laminated.

The cathode layer 29b is for connecting the organic LED 25 and the contact portion 26. The cathode layer 29b is formed by the same process as the cathode layer 29a, as in the first embodiment, and hence is formed of the same material as the cathode layer 29a, and in the same film thickness. Specifically, the cathode layer 29b is formed of a material having excellent electrical conduction property, such as Al, Cu, or the like, and the film thickness is about from 5 to 40 nanometers. The cathode layer 29b is actually formed integrally with the cathode layer 29a, but explained separately for easy understanding of the present invention.

The connection layer 30 is for ensuring electrical connection in the contact portion 26. Since the cathode layer 29b is very thin, and as in the first embodiment, particularly on the sides of the hole, it is necessary to prevent a stepped cut in the cathode layer 29b and ensure a sufficient electrical conduction property. The connection layer 30 is formed by the same process as the anode layer 27, and hence is formed of the same material as the anode layer 27 and in the same film thickness.

The diamond-like carbon film 28b is for preventing a direct contact between the connection layer 30 and the cathode layer 29b. When metal materials having different work functions come in direct contact with each other, the electrical conduction property may deteriorate due to oxidation or the like. Therefore, the diamond-like carbon film 28b is located to maintain excellent electrical conduction property. The diamond-like carbon film 28b is formed by the same process as the diamond-like carbon film 28a, and actually, formed integrally with the diamond-like carbon film 28a. Therefore, the film thickness and the material of the diamond-like carbon film 28b is the same as those of the diamond-like carbon 28a, and hence the explanation thereof is omitted.

The organic light-emitting display apparatus according to the second embodiment has a structure such that the diamond-like carbon film 28a is located below the cathode layer 29a in the organic LED 25, and the diamond-like carbon film 28a has a work function as low as about 0.5 electron volts, which is lower than that of the general metal materials. Therefore, the diamond-like carbon film 28a can fulfill the electron injection function more effectively. Further, since the diamond-like carbon film 28a is located, it is not necessary to form the cathode layer 29a from a material having a low work function, and an optional material can be used. As a result, the cathode layer 29a can be made of Al, Cu, or the like, which has excellent electrical conduction property and adherence to other materials.

Since the diamond-like carbon film 28b is located between the connection layer 30 and the cathode layer 29b in the contact portion 26, a contact of metal layers having largely different work functions can be suppressed. Therefore, even when a small amount of oxygen, moisture, and the like infiltrates into the organic light-emitting display apparatus, oxidation and corrosion of the cathode layer 29b can be suppressed, and an excellent electrical conduction property can be ensured in the contact portion 26. Further, since the cathode layer 29a can be formed of an optional material in the organic LED 25, a material in which oxidation and corrosion are unlikely to occur can be used for the cathode layer 29b, which is made of the same material as the cathode layer 29a, and as a result, more excellent electrical conduction property can be ensured in the contact portion 26.

The organic light-emitting display apparatus according to the second embodiment can be manufactured basically by the same process as the method explained in the first embodiment. However, the organic light-emitting display apparatus according to the second embodiment has a structure in which the diamond-like carbon film is not provided on the anode layer, but the diamond-like carbon films 28a and 28b are provided below the cathode layers 29a and 29b. Therefore, at the step shown in FIG. 5B, it is not necessary to deposit the diamond-like carbon film 23, but at the step shown in FIG. 6C, it is necessary to arrange the diamond-like carbon films 28a and 28b, before arranging the cathode layer. Hence, when the organic light-emitting display apparatus according to the second embodiment is manufactured, after the light-emitting layer 11 is deposited, a single shadow mask or the like is used to continuously deposit the diamond-like carbon films and the conductive layers. By using such a method, the organic light-emitting display apparatus can be manufactured, without increasing the number of patterns such as a shadow mask, as compared with the conventional method. Since the diamond-like carbon film is deposited after forming the light-emitting layer 11, the temperature condition at the time of deposition needs to be not higher than the glass transition point of the organic material constituting the light-emitting layer 11. Therefore, it is preferred to deposit the diamond-like carbon films 28a and 28b by, for example, vacuum evaporation, which can form a good quality thin film under such a low temperature condition.

The third embodiment will be explained below. The organic light-emitting display apparatus according to the third embodiment has a structure such that the diamond-like carbon film is located on both the anode side and the cathode side of the light-emitting layer in the organic LED, and at least two layers of the diamond-like carbon film are located between the connection layer and the cathode layer in the contact portion. Like parts as in the first and the second embodiments are denoted by like reference signs, and have the same structure and function, unless otherwise specified.

Figure 8:
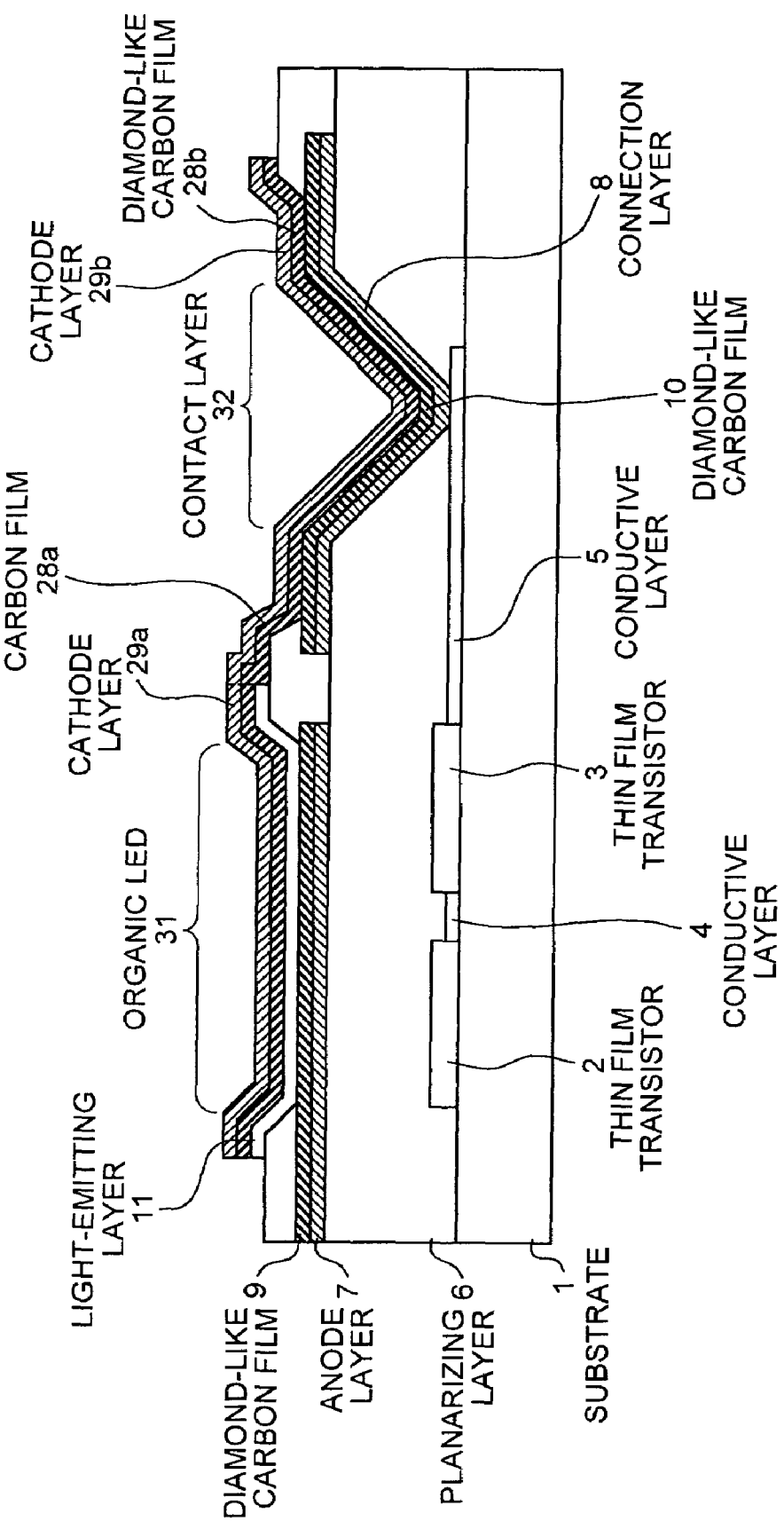
FIG. 8 is a sectional view of a part of a pixel in an organic light-emitting display apparatus according to the third embodiment.
Figure 9:
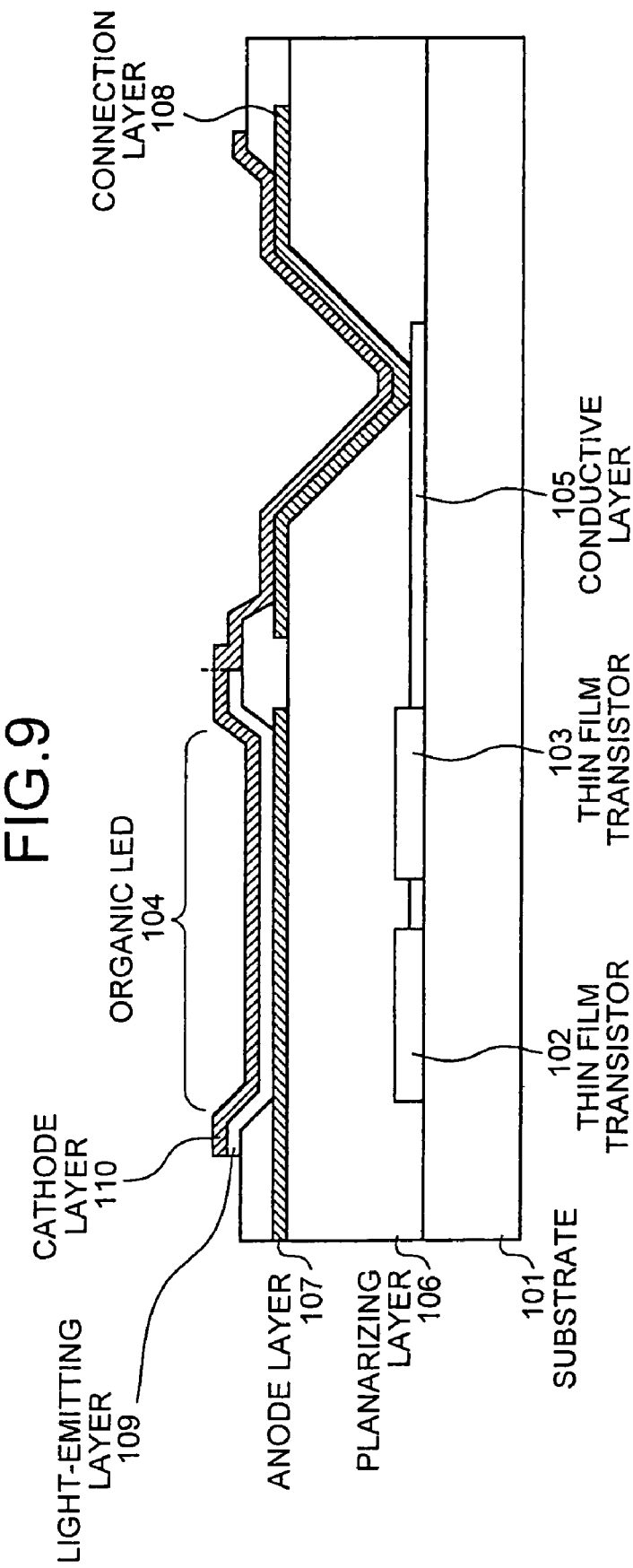
FIG. 9 is a sectional view of a part of a pixel in a conventional organic light-emitting display.

FIG. 8 is a sectional view of a part of a pixel in the organic light-emitting display apparatus according to the third embodiment. As shown in FIG. 8, thin film transistors 2 and 3 and conductive layers 4 and 5 constituting the emission control circuit are located on the substrate 1. The planarizing layer 6 having the hole on a partial region of the conductive layer 5 is located on the substrate 1, the thin film transistors 2 and 3, and the conductive layers 4 and 5. An organic LED 31 is located on the planarizing layer 6. A contact portion 32 is located along the hole of the planarizing layer 6, so as to electrically connect the cathode side of the organic LED 31 with the conductive layer 5.

The organic LED 31 functions as a light-emitting device, as in the first and the second embodiments. Specifically, the organic LED 31 has a structure in which the anode layer 7, the diamond-like carbon film 9, the light-emitting layer 11, the diamond-like carbon film 28a, and the cathode layer 29a are sequentially laminated. A hole transport layer and an electron transport layer may be provided, if necessary, as is described in the first and the second embodiments.

The anode layer 7 has a function as an anode electrode, and a function of connecting the organic LED 31 with the power source line (not shown). The diamond-like carbon film 9 has a function of injecting holes to the light-emitting layer 11. To fulfill such a function, the diamond-like carbon film is formed so as to have a high work function.

The diamond-like carbon film 28a has a function of injecting electrons to the light-emitting layer 11, and is formed so as to have a low work function. Further, the cathode layer 29a has a function as a cathode electrode, and a function of electrically connecting the organic LED 31 with the contact portion 32.

In the third embodiment, since the hole injection function and the electron injection function are respectively performed by the diamond-like carbon films 9 and 28a, the anode layer 7 and the cathode layer 29a can be formed of an optional material. Therefore, the anode layer 7 and the cathode layer 29a are made of, for example, Al or Cu.

The contact portion 32 has a structure in which a connection layer 8, the diamond-like carbon film 10, the diamond-like carbon film 28b, and the cathode layer 29b are sequentially laminated. In other words, the contact portion 32 has a structure in which the diamond-like carbon films 10 and 28b are located between the connection layer 8 and the cathode layer 29b. Therefore, even when the work functions of the respective materials forming the connection layer 8 and the cathode layer 29b are different, oxidation and corrosion of the cathode layer 29b can be suppressed, due to the same reason as in the first and the second embodiments.

The connection layer 8 is made of the same material, in the same film thickness, and by the same process as the anode layer 7, as in the first embodiment. The cathode layer 29b is integrally formed with, and of the same material and in the same film thickness as the cathode layer 29a, as in the second embodiment. Since the anode layer 7 and the cathode layer 29a can be formed of an optional material, as explained for the organic LED 31, the connection layer 8 and the cathode 29b can be also formed of an optional material.

In the third embodiment, it is desired to use the material constituting the connection layer 8 and the material constituting the cathode layer 29b, which have at least the same work function. Since the diamond-like carbon films 10 and 28b are located therebetween, the connection layer 8 and the cathode layer 29b do not come in contact with each other. However, for example, when the film thickness of the diamond-like carbon films 10 and 28b is very thin, the connection layer 8 and the cathode layer 29b substantially come in contact with each other, thereby causing oxidation and corrosion of the cathode layer 29b. Therefore, to prevent oxidation and corrosion of the cathode layer 29b when the connection layer 8 and the cathode layer 29b substantially come in contact with each other, in the third embodiment, it is desired to form the connection layer 8 and the cathode layer 29b, using materials at least having a substantially equal work function. This is because when a difference in the work function is small, even if the connection layer 8 and the cathode layer 29b substantially come in direct contact with each other, the connection layer 8 does not promote oxidation and corrosion of the cathode layer 29b.

For the easiest selection of materials, the same material is used for forming the connection layer 8 and the cathode layer 29b. In this case, not only the work function becomes completely equal, but also the complexity in the manufacturing process can be reduced. Even different materials can prevent oxidation and corrosion of the cathode layer 29b, so long as these have a substantially equal work function, for example, Zn and Al.

As is obvious from the comparison of FIG. 8 to FIG. 1 and FIG. 7, the organic light-emitting display apparatus according to the third embodiment has a structure obtained by combining the organic light-emitting display apparatus according to the first embodiment and the organic light-emitting display apparatus according to the second embodiment. Therefore, it is clear that the organic light-emitting display apparatus according to the third embodiment has advantages explained in the first and the second embodiments.

The present invention has been explained according to the first to the third embodiments, but needless to say, the present invention is not limited by the description and the drawings, being a part of this disclosure. Various embodiments, examples, and operational techniques will become obvious to those skilled in the art from this disclosure. For example, in the first and the third embodiments, the anode layer 7 and the diamond-like carbon film 9 are located on the same region by using the same mask, but the diamond-like carbon film 9 may be located only below the light-emitting layer 11. The diamond-like carbon film 9 is mainly for fulfilling the hole injection function, and hence it is not always necessary to extend it up to the power source line. In this case, however, a mask pattern different from a pattern for forming the anode layer 7 becomes necessary. Therefore, from a standpoint of simplifying the manufacturing process, the structures shown in FIG. 1 and FIG. 8 are preferable. Likewise, the diamond-like carbon film 10 may be located only in a region where the connection layer 8 and the cathode layer 12 are side by side.

The same thing applies to the second and the third embodiments. In FIG. 7 and FIG. 8, the cathode layer 29a is completely overlapped on the diamond-like carbon film 28a, but the diamond-like carbon film 28a may be located only on the light-emitting layer 11. Likewise, the diamond-like carbon film 28b may be located only in the region where the cathode layer 29b overlaps on the connection layer 30. In the first to the third embodiments, a film structure other than the diamond-like carbon film may be located between the connection layer and the cathode layer, or more than three layers of the diamond-like carbon film may be located.

The organic light-emitting display apparatus according to the first to the third embodiments have a structure in which an image is displayed by an active matrix driving as shown in FIG. 4, but a structure in which an image is displayed by a passive matrix driving may be used. The present invention is applicable to the structure in which the emission control circuit and the light-emitting device are located on different layers, regardless of the driving. Even when a part of the emission control circuit is located on the same layer as the light-emitting device, if the electrical connection between the emission control circuit and the organic LED is obtained three-dimensionally, the contact portion shown in the first to the third embodiments becomes necessary. Hence, needless to say, the present invention is applicable thereto.

Even when the emission control circuit and the light-emitting device are located on the same layer, the structure in which the diamond-like carbon film is incorporated in the organic LED as a hole or electron injection layer is effective. Even when these are located on the same layer, by realizing the function of supplying holes or electrons by the diamond-like carbon film, advantages relating to the organic LED, such as excellent carrier injection function, can be obtained.

In the first to the third embodiments, in the organic LED, the diamond-like carbon film functions only as the hole or electron injection layer, and the anode electrode and the cathode electrode are separately located. However, the present invention is not limited to such a structure, and needless to say, a structure in which the diamond-like carbon film serves as the anode electrode or the cathode electrode having a carrier injection function is included in the present invention.

In the first to the third embodiments, in the organic LED, the anode side is on the lower layer, and the cathode side is on the upper layer, but the present invention is also applicable to the reverse structure. In this case, there is also an advantage in that oxidation and corrosion can be suppressed, by preventing a direct contact between metal materials by the diamond-like carbon film having a different work function in the contact portion.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An organic light-emitting display apparatus comprising:
    a substrate;
    an emission control circuit formed on the substrate;
    an insulating layer covering the control circuit;
    an organic light-emitting device including a first electrode and a second electrode, and formed on the insulating layer; and
    a contact wiring structure for electrically connecting the emission control circuit and the organic light-emitting device, and including
        a first conductive layer made of the same material as the first electrode;
        a second conductive layer made of the same material as the second electrode; and
        a non-insulating diamond-like carbon film interposed between the first conductive layer and the second conductive layer, and electrically connected there between.

2. The organic light-emitting display apparatus according to claim 1, wherein the first electrode includes a material selected from the group consisting of aluminum and copper.

3. The organic light-emitting display apparatus according to claim 1, wherein the diamond-like carbon film between the first conductive layer and the second conductive layer contains fluorine.

4. The organic light-emitting display apparatus according to claim 1, wherein the light-emitting device includes
    a light-emitting layer made of an organic material generating light by charge injection; and
    a diamond-like carbon film between the emitting layer and the first electrode.

5. The organic light-emitting display apparatus according to claim 4, wherein the diamond-like carbon film between the emitting layer and the first electrode contains fluorine.

6. The organic light-emitting display apparatus according to claim 4, wherein
    the first electrode is an anode to supply holes to the emitting layer,
    the second electrode is a cathode to supply electrons to the emitting layer, and
    the light-emitting device further includes a diamond-like carbon film between the emitting layer and the second electrode.

7. The organic light-emitting display apparatus according to claim 6, wherein the diamond-like carbon film between the emitting layer and the second electrode contains fluorine.

8. The organic light-emitting display apparatus according to claim 1, wherein the second electrode includes a material with substantially the same work function as the first electrode.

9. The organic light-emitting display apparatus according to claim 1, wherein the second electrode is made of the same material as the first electrode.

10. The organic light-emitting display apparatus according to claim 1, wherein
    the emission control circuit includes
        a driver device controlling current supplied to the organic light-emitting device, and
        a switching device controlling the driver device based on a scan signal and a data signal, and
    the contact wiring structure is electrically connected to the driver device.

11. The organic light-emitting display apparatus according to claim 1, wherein the diamond-like carbon film has an SP3 bond of carbon atoms and an SP2 bond of carbon atoms.

12. The organic light-emitting display apparatus according to claim 1, wherein the diamond-like carbon film has a work function from 0.5 to 5.6 electron volts.

* * * * *